US012674694B2

(12) United States Patent
Gerding et al.

(10) Patent No.: US 12,674,694 B2
(45) Date of Patent: Jul. 7, 2026

(54) TEST DEVICE FOR A MODULAR MAGNETIC-INDUCTIVE FLOWMETER, TEST METHOD FOR SUCH A TEST DEVICE, TEST DEVICE FOR A MONOLITHIC MAGNETIC-INDUCTIVE FLOWMETER, AND TEST METHOD FOR SUCH A TEST DEVICE

(71) Applicant: KROHNE Messtechnik GmbH, Duisburg (DE)

(72) Inventors: Michael Gerding, Bochum (DE); Olaf Kaluza, Herten (DE); Wilhelm Florin, Duisburg (DE)

(73) Assignee: Krohne Messtechnik GmbH, Duisburg (DE)

( * ) Notice: Subject to any disclaimer, the term of this patent is extended or adjusted under 35 U.S.C. 154(b) by 355 days.

(21) Appl. No.: 18/455,052

(22) Filed: Aug. 24, 2023

(65) Prior Publication Data

US 2024/0068854 A1     Feb. 29, 2024

(30) Foreign Application Priority Data

Aug. 24, 2022     (DE) ..................... 10 2022 121 407.9

(51) Int. Cl.
G01F 1/60 (2006.01)
G01F 1/58 (2006.01)
(Continued)

(52) U.S. Cl.
CPC ................. G01F 1/60 (2013.01); G01F 1/58 (2013.01); G01F 1/588 (2013.01); G01F 25/10 (2022.01); G01F 25/17 (2022.01); G01R 33/02 (2013.01)

(58) Field of Classification Search
CPC ... G01F 1/60; G01F 1/58; G01F 1/588; G01F 25/10; G01F 25/17; G01R 33/02
See application file for complete search history.

(56) References Cited

U.S. PATENT DOCUMENTS 4,346,604 A      8/1982 Snook et al.
7,194,918 B2 *   3/2007 Brockhaus .............. G01F 1/586
                                                73/861.12
(Continued)

FOREIGN PATENT DOCUMENTS

CN      204963918 U     1/2016
DE      19713751 A1     10/1998
(Continued)

*Primary Examiner* — Ryan D Walsh
(74) *Attorney, Agent, or Firm* — Muncy, Geissler, Olds & Lowe, P.C.

(57) ABSTRACT

A test device for a modular magnetic-inductive flowmeter is disclosed. The test device allows for a dry functional test which does not require measurement of a current through a coil of the modular magnetic-inductive flowmeter. The test device includes a test controller and a test measuring module for a measuring module receptacle of the modular magnetic-inductive flowmeter. The test measuring module has a holder with a magnetic field sensor. The test controller stores at least one setpoint value of at least one variable of the magnetic field. The test controller is designed to measure at least one actual value of the at least one magnitude of the magnetic field using the magnetic field sensor when the test measuring module is inserted into the measuring module receptacle and to determine a deviation of the at least one actual value from the at least one setpoint value and to display the deviation.

16 Claims, 5 Drawing Sheets

(51) Int. Cl.
  *G01F 25/10*     (2022.01)
  *G01F 25/17*     (2022.01)
  *G01R 33/02*     (2006.01)

(56)      References Cited

U.S. PATENT DOCUMENTS

| | | | |
|---|---|---|---|
| 7,750,642 B2* | 7/2010 | Graber | G01F 25/10 |
| | | | 73/861.12 |
| 9,970,795 B2* | 5/2018 | Hunter | G01F 1/58 |
| 10,557,745 B2* | 2/2020 | Shimura | G01F 1/58 |
| 2005/0223815 A1* | 10/2005 | Florin | G01F 25/10 |
| | | | 73/861.12 |
| 2008/0250866 A1* | 10/2008 | Tschabold | G01F 1/60 |
| | | | 73/861.11 |
| 2009/0260452 A1* | 10/2009 | Rasmussen | G01F 25/10 |
| | | | 73/861.12 |
| 2018/0356267 A1* | 12/2018 | Brockhaus | G01F 15/18 |
| 2020/0309579 A1* | 10/2020 | Brockhaus | G01F 1/586 |
| 2023/0013776 A1* | 1/2023 | Voigt | G01F 1/586 |

FOREIGN PATENT DOCUMENTS

| | | |
|---|---|---|
| DE | 10 2004 057 680 | 6/2006 |
| DE | 10 2015 120 103 | 5/2017 |
| WO | 2021/121957 A1 | 6/2021 |

* cited by examiner 21,23

10

9

26

21,23

10

9

25

22

24

TEST DEVICE FOR A MODULAR MAGNETIC-INDUCTIVE FLOWMETER, TEST METHOD FOR SUCH A TEST DEVICE, TEST DEVICE FOR A MONOLITHIC MAGNETIC-INDUCTIVE FLOWMETER, AND TEST METHOD FOR SUCH A TEST DEVICE

TECHNICAL FIELD

The invention relates to several items.

One item of the invention is a test device for a modular magnetic-inductive flowmeter.

The modular magnetic-inductive flowmeter to be tested has a coil, a controller, and a measurement module receptacle for a measurement module. The measurement module receptacle has a first terminal and a second terminal. The first terminal and the second terminal are each connected to the controller via a measuring line.

The measuring module has a first terminal, a second terminal and a measuring tube with two measuring electrodes.

By inserting the measuring module into the measuring module receptacle, the first terminals, on the one hand, and the second terminals, on the other hand, can each be connected to one another. When the measuring module is inserted into the measuring module receptacle, the first terminal of the measuring module and the first terminal of the measuring module receptacle are electrically connected to each other, and the second terminal of the measuring module and the second terminal of the measuring module receptacle are electrically connected to each other.

When the measuring module is inserted, the coil is designed to generate a magnetic field in a medium in the measuring tube, the measuring electrodes are designed to tap a measuring voltage in the medium generated by flowing the medium in the magnetic field, and the controller is designed to determine a flow rate of the medium using the measuring voltage transmitted via the first and second terminals and the measuring lines. Also, the controller is designed to control the coil.

Thus, when the measuring module is inserted into the measuring module receptacle and the magnetic-inductive flowmeter is in operation, in particular a medium is made to flow through the measuring tube, the following applies: The coil is designed to generate the magnetic field in the medium in the measuring tube. The measuring electrodes are designed to tap the measuring voltage in the medium generated by the flow of the medium in the magnetic field. The controller is designed to determine the flow rate of the medium using the measuring voltage transmitted through the first and second terminals and the measuring lines. Accordingly, one of the two measuring electrodes is connected to the first terminal of the measuring module, the first terminal of the measuring module is connected to the first terminal of the measuring module receptacle, and the first terminal of the measuring module receptacle is connected to the controller via one of the two measuring lines. Accordingly, the other of the two measuring electrodes is connected to the second terminal of the measuring module, the second terminal of the measuring module is connected to the second terminal of the measuring module receptacle, and the second terminal of the measuring module receptacle is connected to the controller via the other of the two measuring lines. In this way, the voltage tapped between the measuring electrodes is also present at the controller.

A further item of the invention is a test method for a test device for such a modular magnetic-inductive flowmeter.

Another item is a test device for a monolithic magnetic-inductive flowmeter.

The monolithic magnetic-inductive flowmeter to be tested has a coil, a controller, and a measuring tube with two measuring electrodes. Each of the measuring electrodes is connected to the controller via a respective measuring line.

The coil is designed to generate a magnetic field in a medium in the measuring tube. The measuring electrodes are designed for tapping a measuring voltage in the medium generated by a flow of the medium in the magnetic field. The controller is designed to determine a flow rate of the medium using the measuring voltage transmitted via the measuring lines. The coil is arranged outside the measuring tube. Therefore, the magnetic field generated by the coil during operation extends not only to a medium in the measuring tube, but also to an external space around the measuring tube.

A further item of the invention is a test method for a test device for such a monolithic magnetic-inductive flowmeter.

Both the modular and the monolithic magnetic-inductive flowmeter are magnetic-inductive flowmeters. The modular magnetic-inductive flowmeter differs from the monolithic magnetic-inductive flowmeter in particular by its modular design. This is implemented by the measuring module receptacle and the measuring module. Modular magnetic-inductive flowmeters are used, in particular, in applications where the flow of different media has to be determined consecutively and the media are not allowed to come into contact with each other. For this purpose, only the measuring module of a modular magnetic-inductive flowmeter must be exchanged. Such applications, which include, in particular, applications in which cross-contamination must be avoided, are found in medicine, for example, where flow measurements of the blood of different persons are carried out.

BACKGROUND

A magnetic-inductive flowmeter is basically calibrated so that it determines a flow of a medium through the measuring tube with a certain accuracy. Flow means a flow rate and this refers to a volume or a mass. An essential step of such a calibration is that a known medium is made to flow through the measuring tube at a known velocity, a flow rate is determined using the velocity and a geometry of the measuring tube and is assigned to a measuring voltage measured by the controller. This essential step is usually performed multiple times and/or for different flows to increase an accuracy of the calibration. Accordingly, calibration requires a device in which a magnetic-inductive flowmeter is mounted for calibration, and which generates known flows of a medium. Consequently, calibration of a magnetic-inductive flowmeter involves considerable effort.

Calibration inherently includes a functional test of the control system. There is a need to be able to perform a functional test of the controller independent of a costly calibration. Such functional tests include dry functional tests. In a dry functional test, the measuring tube is free of a medium.

A test device is known from the prior art which determines a measure of a strength of the magnetic field from a current through the coil of the magnetic-inductive flowmeter to be tested, generates a test voltage from this measure and a flow rate specified by the test device, and supplies this voltage between the measuring electrodes. The magnetic-inductive flowmeter then determines a flow rate from the test voltage, which is comparable to the flow rate set on the test device. This represents a functional test of the controller of the electromagnetic flowmeter.

A disadvantage of this test device is that the current through the coil must be measured to obtain a measure of the strength of the magnetic field. Measuring the current can be done in a simple manner if an appropriate interface is provided on the magnetic-inductive flowmeter. If such an interface is not present, the effort required to measure the current increases.

SUMMARY

An object of the present invention is to provide a test device and a test method for a dry functional test, which does not require a measurement of the current through the coil.

The object is achieved by a test device for a modular magnetic-inductive flowmeter having the disclosed features. The test device is characterized in that it comprises a test controller and a test measuring module for the measuring module receptacle. The test measurement module has a holder with a magnetic field sensor. At least one setpoint value of at least one variable of the magnetic field is stored in the test controller. The test controller is designed to measure at least one actual value of the at least one variable of the magnetic field using the magnetic field sensor when the test measurement module is set. Furthermore, the test controller is designed to determine a deviation of the at least one actual value from the at least one setpoint value and to display the deviation. For displaying the deviation, the test controller preferably has a display.

The test measuring module, like the measuring module, is compatible with the measuring module receptacle. The test controller, for example, is arranged in the test measuring module. The test measuring module and the holder are designed in such a way that the magnetic field sensor is arranged where the magnetic field generated by the coil is during operation of the electromagnetic flowmeter when the test measuring module is inserted in the measuring module receptacle. The magnetic field sensor is thus arranged in the magnetic field. Preferably, the magnetic field sensor is arranged where a medium flows through the measuring tube when the measuring module is arranged in the measuring module receptacle. Thus, the magnetic field sensor measures a magnitude of the magnetic field where, during operation of the magnetic-inductive flowmeter, a medium flows through the magnetic field generated by the coil and the measuring voltage is induced in the medium.

The test device according to the invention enables measurement of a variable of the magnetic field without the need to determine a current through the coil. The determination and display of the deviation constitutes a dry functional test of the modular magnetic-inductive flowmeter.

In one design of the modular magnetic-inductive flowmeter, the test measurement module includes a first terminal and a second terminal, and the first terminal and the second terminal are each connected to the test controller. Further, by inserting the test measuring module into the measuring module receptacle, on the one hand, the first terminals and, on the other hand, the second terminals can each be connected to each other. The test controller is further designed to supply a test voltage between the first terminal and the second terminal. In the context of the invention, the first and second terminals are always electrical terminals and are designed, for example, as plug connectors.

If the test measuring module is inserted into the measuring module receptacle, then, on the one hand, the first terminal of the test measuring module and the first terminal of the measuring module receptacle and, on the other hand, the second terminal of the test measuring module and the second terminal of the measuring module receptacle are electrically connected to each other. During operation, when the test measurement module supplies the test voltage between the first and second terminals, the test voltage drops across the first and second terminals. This test voltage is conducted via the first and second terminals and via the measuring lines to the controller, where the test voltage is present as measuring voltage.

In a further design, the test measurement module can be manually inserted into, removed from, and fixed in the module holder without tools and without causing damage. The test measuring module and the module holder are designed accordingly. Preferably, this also applies to the measuring module. This design simplifies the performance of the dry functional test.

In a further design, the holder is a measuring tube. Preferably, this measuring tube is the measuring tube of a measuring module. This simplifies the manufacture of the test measuring module, since the same components can be used. In an alternative, the test measuring module is based on the measuring module, i.e. it is a modified measuring module.

Further, the object is also achieved by a test device for a monolithic magnetic-inductive flowmeter having the disclosed features. The test device is characterized in that it comprises a test controller and a magnetic field sensor. The test controller is designed to arrange the magnetic field sensor in the magnetic field, preferably in the measuring tube. At least one setpoint value of at least one variable of the magnetic field is stored in the test controller. The magnetic field sensor is designed to measure at least one actual value of the at least one quantity of the magnetic field and the test controller is designed to determine a deviation of the at least one actual value from the at least one setpoint value and to display the deviation. Accordingly, the test controller is designed such that the magnetic field sensor can be arranged in the magnetic field in the external space around the measuring tube or in the magnetic field in the measuring tube.

In one design, the test controller can be connected to the measuring electrodes in a way that is reversible and damage-free. For this, the test controller has, for example, test lines which can be connected directly to the measuring electrodes on the measuring tube. The measuring electrodes are connected to the controller via the test leads. Often, the measuring electrodes and the test leads are connected to each other via plug connectors. In this case, it is convenient to connect the test controller to the measuring electrodes via these plug connectors.

In a further design of the magnetic-inductive flowmeter, be it the modular or the monolithic magnetic-inductive flowmeter, the at least one variable of the magnetic field is a strength and/or a frequency and/or a settling time of the magnetic field. Accordingly, the magnetic field sensor is configured to measure the strength and/or the frequency of the magnetic field.

In a further development of designs comprising supplying a test voltage, the variable is a strength of the magnetic field. The test controller is then designed to measure an actual value of the strength of the magnetic field, to determine a setpoint value for the measurement voltage for a setpoint value of a flow of a medium using the actual value of the strength of the magnetic field, to generate the test voltage with the setpoint value, to read an actual value of the flow determined by the controller from the controller, to determine a deviation of the actual value from the setpoint value, and to display the deviation. The strength of the magnetic field usually consists of a magnitude and a polarity. The setpoint value of the flow rate is specified or stored in the test controller, for example.

During operation of the magnetic-inductive flowmeter and the test controller, the following is performed:

The magnetic field is generated by the controller using the coil. The magnetic field is, for example, an alternating magnetic field. The test controller then measures an actual value of the strength of the magnetic field, determines a setpoint for the measuring voltage using the actual value of the strength of the magnetic field to a setpoint value of a flow rate, generates the test voltage with the setpoint value and supplies it between the first and second terminals. The controller measures this test voltage as a measurement voltage and determines an actual value of the flow of the medium using the measurement voltage. The test controller then reads the actual value of the flow rate determined by the controller from the controller, determines a deviation of the actual value from the setpoint value and displays the deviation.

In a further development of the previously described design, as components, the controller has the measuring lines, an amplifier for amplifying the measuring voltage, an analog-to-digital converter for digitizing the amplified measuring voltage, a computing unit for determining the flow rate of the medium using the digitized measuring voltage, and an interface for output of the determined flow rate. Further, the test controller is designed to test at least one of the components using the previously determined deviation. The test controller is designed, for example, to read the actual value of the flow rate at the interface.

In a further design, the at least one setpoint value is a previously measured actual value, such that the deviation is a measure of reproducibility. Preferably, the steps associated with this design for generating the setpoint values and the actual values are performed multiple times, thereby determining reproducibility with higher reliability.

In a further design, the test device comprises an energy storage device and the test device is designed to be supplied with energy from the energy storage device.

In yet another design, the test device is designed to be powered by a magnetic-inductive flowmeter.

In a further design, the magnetic field sensor is a Hall sensor.

The object is also achieved by a test method for a test device for the modular magnetic-inductive flowmeter described above having the disclosed features. The test method is performed by a test device comprising a test controller and a test measuring module for the measuring module receptacle. The test measurement module comprises a holder with a magnetic field sensor.

According to the method, at least one setpoint value of at least one variable of the magnetic field is stored by the test controller and the test measuring module is inserted into the measuring module receptacle of the modular magnetic-inductive flowmeter to be tested. Then, the magnetic field is generated by the coil and at least one actual value of the at least one variable of the magnetic field is measured by the test controller using the magnetic field sensor. Further, a deviation of the at least one actual value from the at least one setpoint value is determined and displayed by the test controller.

In one design of the test method, its test device is designed as in one of the previously described designs and further developments of the test device for the modular magnetic-inductive flowmeter.

The object is also achieved by a test method for a test device for the monolithic magnetic-inductive flowmeter described above having the disclosed features.

The test method is performed by a test device comprising a test controller and a magnetic field sensor. The test device is designed to arrange the magnetic field sensor in the magnetic field, preferably in the measuring tube.

According to the method, at least one setpoint value of at least one variable of the magnetic field is stored by the test controller. Then the magnetic field is generated by the coil and at least one actual value of the at least one variable of the magnetic field is measured by the test controller using the magnetic field sensor. Further, a deviation of the at least one actual value from the at least one setpoint value is determined and displayed by the test controller.

In one design of the test method, its test device is designed as in one of the previously described designs and further developments of the test device for the monolithic magnetic-inductive flowmeter.

In one design of the test method, a dry calibration method is performed using the deviation. Dry calibration methods differ from the previously mentioned calibration method in that the measuring tube is free of a medium.

In all other respects, the explanations concerning a test device or a test method apply accordingly to the other test devices and test methods.

BRIEF DESCRIPTION OF THE DRAWINGS

In detail, there is a multitude of possibilities for designing and further developing the items of the invention. For this purpose, reference is made to the following description of preferred embodiments in connection with the drawing.

DETAILED DESCRIPTION

Figures 1, 2:
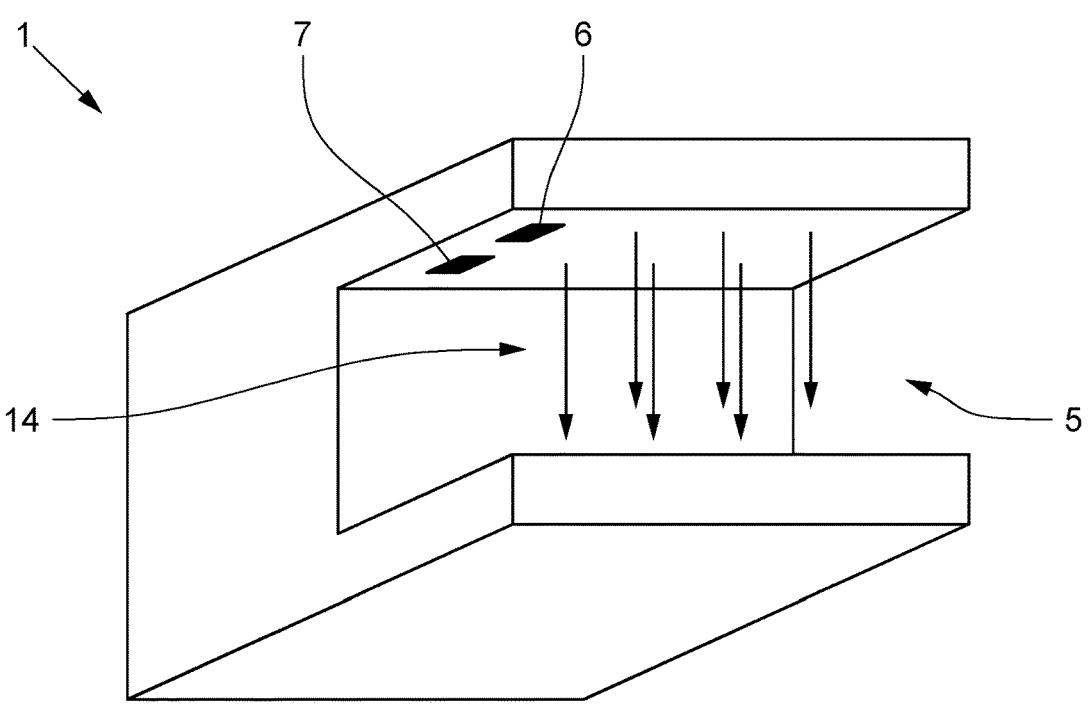
FIG. 1 illustrates an embodiment of a modular magnetic-inductive flowmeter in a perspective side view.
FIG. 2 illustrates the modular magnetic-inductive flowmeter in a cutaway side view.
Figure 3:
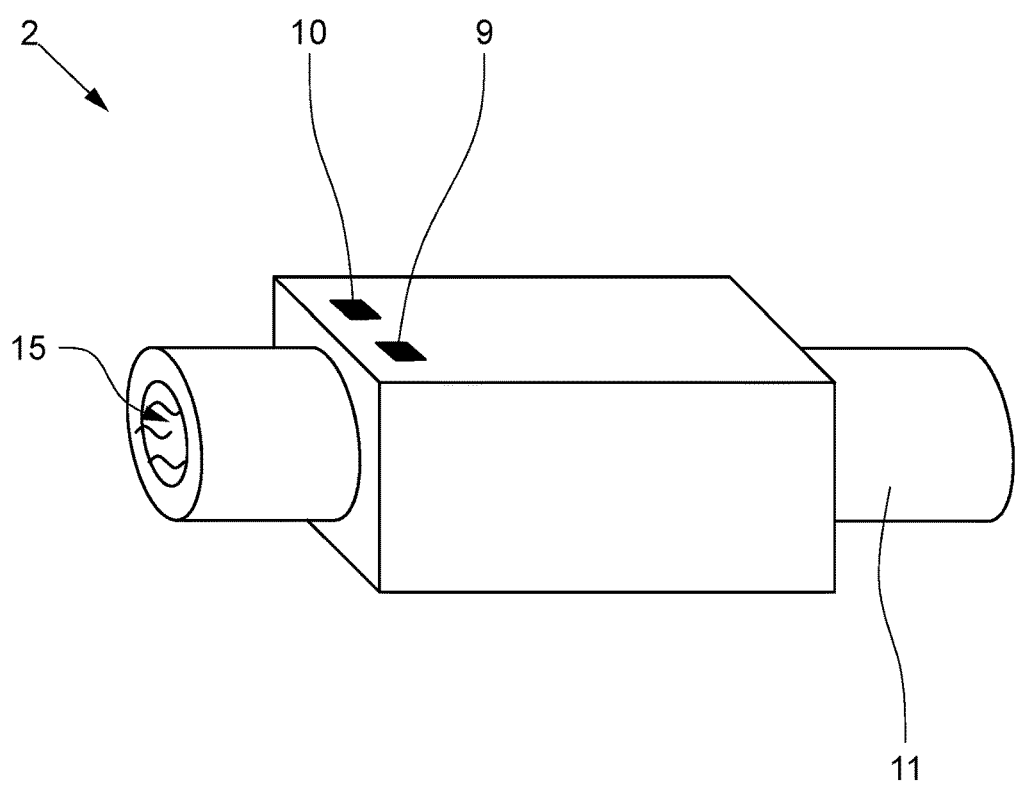
FIG. 3 illustrates an embodiment of a measuring module for the modular magnetic-inductive flowmeter in a perspective side view.
Figure 4:
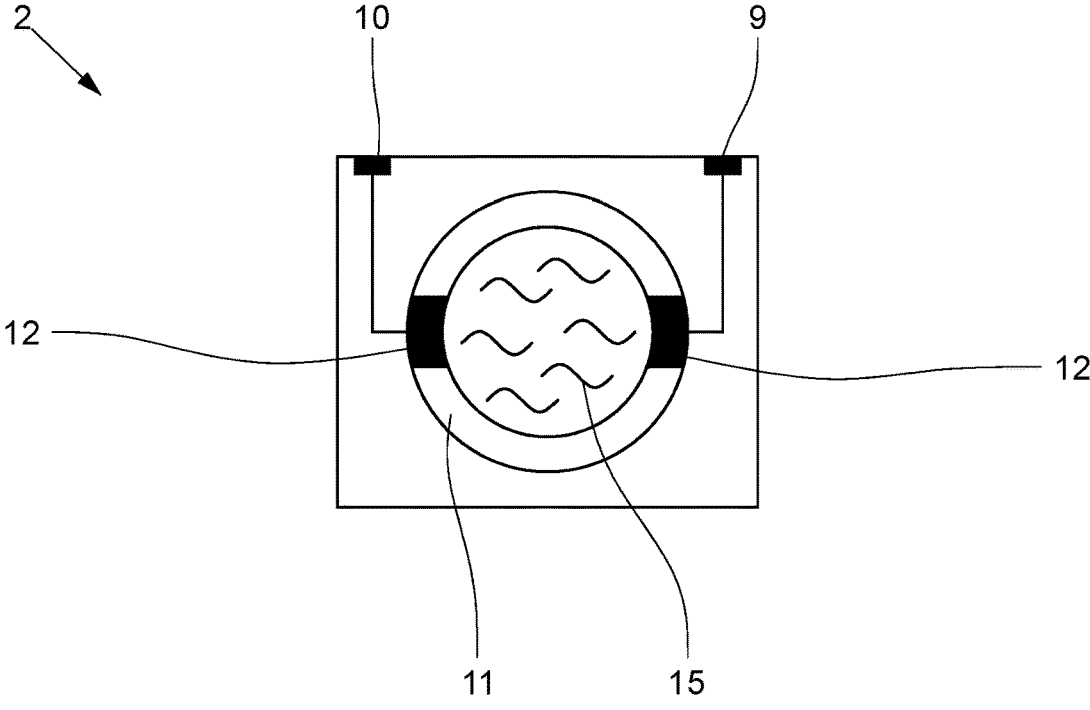
FIG. 4 illustrates the measuring module in a cut side view.

FIGS. 1 to 4 show an embodiment of a modular magnetic-inductive flowmeter 1. The modular magnetic-inductive flowmeter 1 is shown once in a perspective side view, see FIG. 1, and once in a cutaway side view, see FIG. 2, without the embodiment of an associated measuring module 2 shown in FIGS. 3 and 4. FIG. 3 shows the measuring module 2 in a perspective side view and FIG. 4 in a cut side view.

The modular magnetic-inductive flowmeter 1 has a coil 3, a controller 4 and a measuring module receptacle 5 for the measuring module 2. The measuring module receptacle 5 has a first terminal 6 and a second terminal 7. The first terminal 6 and the second terminal 7 are each connected to the controller 4 via a measuring line 8.

The measuring module 2 has a first terminal 9, a second terminal 10 and a measuring tube 11 with two electrons 12.

By inserting the measuring module 2 into the measuring module receptacle 5, the first terminals 6, 9, on the one hand, and the second terminals 7, 10, on the other hand, can be connected to each other.

When the measuring module 2 is inserted, the coil 3 is designed together with a yoke 13 for generating a magnetic field 14 in a medium 15 in the measuring tube 11. The measuring electrodes 12 are designed for tapping a measuring voltage in the medium 15 generated by a flow of the medium 15 in the magnetic field 14. The controller 4 is designed to determine a flow rate of the medium 15 using the measuring voltage transmitted via the first terminals 6, 9 and the second terminals 7, 10 and the measuring lines 8.

Figure 10:
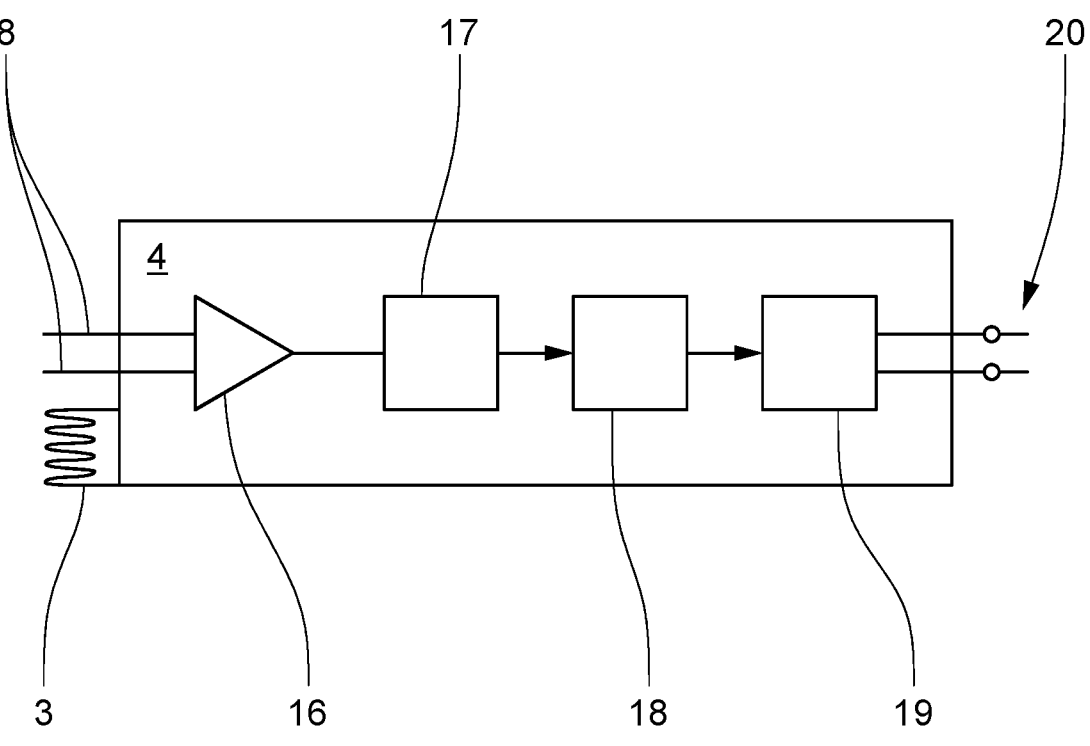
FIG. 10 illustrates a block diagram of the controllers of the modular and the monolithic magnetic-inductive flowmeter.

FIG. 10 shows a block diagram of the controller 4. As components, the controller 4 has the measuring lines 8, an amplifier 16 for amplifying the measuring voltage, an analog-to-digital converter 17 for digitizing the amplified measuring voltage, a computing unit 18 for determining the flow rate of the medium 15 using the digitized measuring voltage, and an interface 19 for outputting the determined flow rate. In this embodiment, the interface 19 is filled in as a current loop interface. The interface 19 is connected to a current loop 20. The modular magnetic-inductive flowmeter 1 is also supplied with electrical power from the current loop 20.

Figures 5, 6:
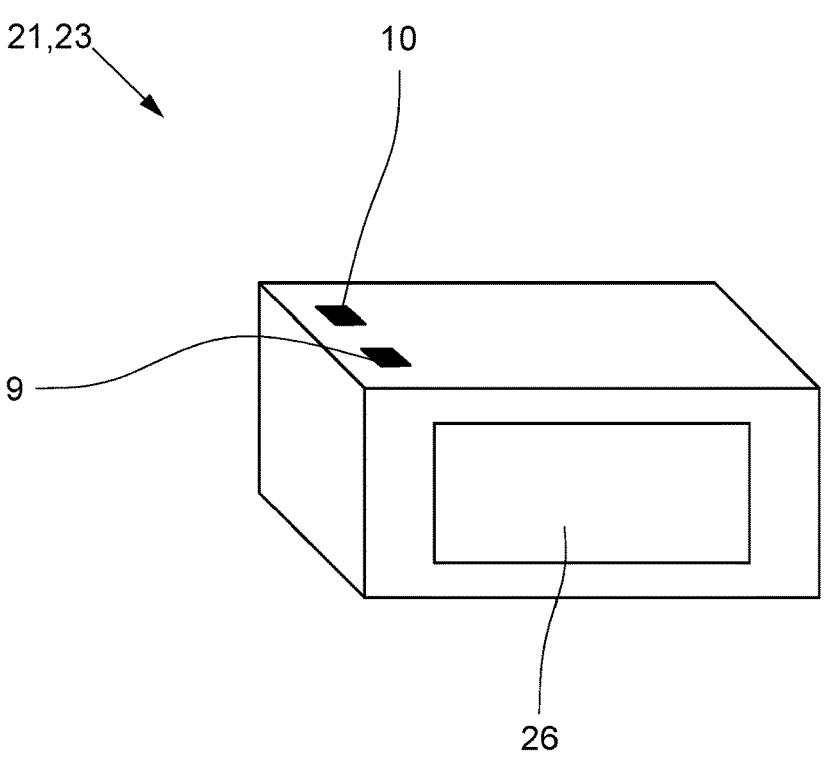
FIG. 5 illustrates an embodiment of a test device for the modular magnetic-inductive flowmeter in a perspective side view.
FIG. 6 illustrates the test device in a cut perspective side view.

FIGS. 5 and 6 show an embodiment of a test device 21 for the modular magnetic-inductive flowmeter 1, once in a perspective side view, see FIG. 5, and once in a cutaway side view, see FIG. 6.

The test device 21 has a test controller 22 and a test measuring module 23 for the measuring module receptacle 5. In this embodiment, the test device 21 is fully integrated into the test measurement module 23. The test measurement module 23 has a holder 24 with a magnetic field sensor 25, a first terminal 9, a second terminal 10, and a display 26. The first terminal 9 and the second terminal 10 are each connected to the test controller 22. The terminals 9, 10 of the test measurement module 23 are designed identically to the terminals 9, 10 of the measurement module 2. By inserting the test measurement module 23, the first terminals 6, 9, on the one hand, and the second terminals 7, 10, on the other hand, are respectively connectable to each other. The test measuring module 23 can be manually inserted into, removed from and fixed in the module holder 5 of the modular magnetic-inductive flowmeter 1 without the need for tools and without causing damage.

The test controller 22 is designed to feed a test voltage between the first terminal 9 and the second terminal 10 of the test measuring module 23. At least one setpoint value of a strength of the magnetic field 14 is stored in the test controller 22 as a variable of the magnetic field 14. It is designed to measure at least one actual value of the strength of the magnetic field 14 using the magnetic field sensor 25 when the test measuring module 23 is inserted. Furthermore, the test controller 22 is designed to determine a deviation of the at least one actual value from the at least one setpoint value and to indicate this on the display 26.

Figures 7, 8:
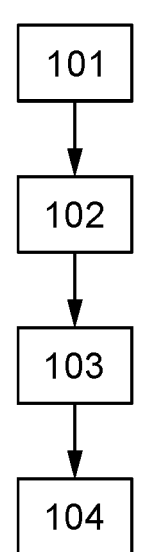
FIG. 7 illustrates a flow chart of an embodiment of a test procedure for the test device.
FIG. 8 illustrates an embodiment of a test device for a monolithic magnetic-inductive flowmeter with such a flowmeter in a front view.

FIG. 7 shows a flowchart of an embodiment of a test method for the test device 21 for the modular magnetic-inductive flowmeter 1. Namely, the following method steps are performed during operation of both the modular magnetic-inductive flowmeter 1 and the test device 21.

In a first method step 101, at least one setpoint value of at least one variable of the magnetic field 14 is stored by the test controller 22.

In a second method step 102, the test measuring module 23 is inserted into the measuring module receptacle 5 of the modular magnetic-inductive flowmeter 1.

In a third method step 103, the magnetic field 14 is then generated by the coil 3, which is controlled by the controller 4, and at least one actual value of the strength of the magnetic field 14 is measured by the test controller 22 using the magnetic field sensor 25.

In a fourth method step 104, a deviation of the at least one actual value from the at least one setpoint value is determined by the test controller 22 and indicated on the display 26.

FIG. 8 shows an embodiment of a test device 27 for a monolithic magnetic-inductive flowmeter 28 and a front view thereof.

The monolithic magnetic-inductive flowmeter 28 has a coil 3, a yoke 13, a controller 4, and a measuring tube 11 with two measuring electrodes 12. Each of the measuring electrodes 12 is connected to the controller 4 via a respective measuring line 8. The coil 3 is designed in conjunction with the yoke 13 to generate a magnetic field 14 in a medium 15 in the measuring tube 11. The measuring electrodes 12 are designed for tapping a measuring voltage in the medium 15 generated by a flow of the medium 15 in the magnetic field 14.

The controller 4 is designed to determine a flow rate of the medium 15 using the measuring voltage transmitted through the measuring leads 8.

The test device 27 has a test controller 22 and a magnetic field sensor 25. The test device 27 is designed to arrange the magnetic field sensor 25 in the magnetic field 14, in this case even in the measuring tube 11. Furthermore, at least one setpoint value of at least one variable of the magnetic field 14 is stored in the test controller 22. Using the magnetic field sensor 25, the test controller 22 is designed to measure at least one actual value of the strength of the magnetic field 14. The test controller 22 is further designed to determine a deviation of the at least one actual value from the at least one setpoint value, and to display the deviation on the display 26.

The test device 27 is designed such that the test controller 22 is reversibly connectable to the measuring electrodes 12 without damage. Further, the test controller 22 is designed to supply a test voltage between the measuring electrodes 12.

In all other respects, the explanations for the test device 21 for the modular magnetic-inductive flowmeter 1 apply accordingly to the test device 27 for the monolithic magnetic-inductive flowmeter 28.

Figure 9:
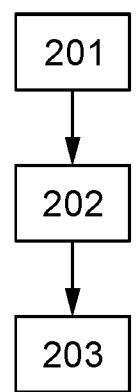
FIG. 9 illustrates a flow chart of an embodiment of a test method for the test device.

FIG. 9 shows a flow chart of an embodiment of a test method for the test device 27 for the monolithic magnetic-inductive flowmeter 28. Namely, the following method steps are performed during operation of both the monolithic magnetic-inductive flowmeter 28 and the test device 27.

In a first method step 201, at least one setpoint value of at least one variable of the magnetic field 14 is stored by the test controller 22.

In a second method step 202, the magnetic field 14 is then generated by the coil 3, which is controlled by the controller 4, and at least one actual value of the magnitude of the magnetic field 14 is measured by the test controller 22 using the magnetic field sensor 25.

In a third method step, a deviation of the at least one actual value from the at least one setpoint value is determined by the test controller 22 and indicated on the display 26.

FIG. 10 shows a block diagram of the controller 4 of the monolithic magnetic-inductive flowmeter 28. It is designed like that of the modular magnetic-inductive flowmeter 1.

The explanations regarding the embodiment of the test device 21 for the modular magnetic-inductive flowmeter 1 apply correspondingly to the test device 27 for the monolithic magnetic-inductive flowmeter 28 and vice versa. The same applies to the modular magnetic-inductive flowmeter 1 and the monolithic magnetic-inductive flowmeter 28.

The invention claimed is:

1. A test device for a modular magnetic-inductive flowmeter, wherein the modular magnetic-inductive flowmeter to be tested includes a coil, a controller and a measuring module receptacle for a measuring module, wherein the measuring module receptacle has a first terminal and a second terminal and the first terminal and the second terminal are each connected to the controller via a measuring line, wherein the measuring module has a first terminal, a second terminal and a measuring tube with two measuring electrodes, wherein, by inserting the measuring module into the measuring module receptacle, on the one hand the first terminals and on the other hand the second terminals can each be connected to one another, wherein, when the measuring module is inserted, the coil is designed to generate a magnetic field in a medium in the measuring tube, the measuring electrodes are designed to tap a measuring voltage in the medium generated by a flow of the medium in the magnetic field, and the controller is designed to determine a flow rate of the medium using the measuring voltage transmitted via the first terminals and second terminals and the measuring lines, the test device comprising:

a test controller; and a test measuring module for the measuring module receptacle;

wherein the test measuring module has a holder with a magnetic field sensor;

wherein at least one setpoint value of at least one variable of the magnetic field is stored in the test controller;

wherein, when the test measuring module is inserted, the test controller is designed, using the magnetic field sensor, to measure at least one actual value of the at least one variable of the magnetic field and to determine a deviation of the at least one actual value from the at least one setpoint value and to display the deviation;

wherein the test measuring module has a first terminal and a second terminal and the first terminal and the second terminal are each connected to the test controller;

wherein, by inserting the test measuring module, the first terminals, on the one hand, and the second terminals, on the other hand, are each connectable to one another; and wherein the test controller is designed to supply a test voltage between the first terminal and the second terminal.

2. The test device according to claim 1, wherein the test measuring module is manually insertable into, removable from and fixable in the module receptacle without tools and without damage.

3. The test device according to claim 1, wherein the holder is a measuring tube.

4. The test device according to claim 1, wherein the at least one variable of the magnetic field is a strength and/or a frequency and/or a settling time of the magnetic field.

5. The test device according to claim 1, wherein the variable is a strength of the magnetic field;

wherein the test controller is designed to measure an actual value of the strength of the magnetic field, to determine a setpoint value for the measurement voltage for a setpoint value of a flow rate using the actual value of the strength of the magnetic field, to generate the test voltage with the setpoint value, to read an actual value of the flow rate determined by the controller from the controller, to determine a deviation of the actual value from the setpoint value and to display the deviation.

6. The test device according to claim 5, wherein, as components, the controller has the measuring lines, an amplifier for amplifying the measuring voltage, an analog-to-digital converter for digitizing the amplified measuring voltage, a calculating unit for determining the flow rate of the medium using the digitized measuring voltage, and an interface for output of the determined flow rate; and wherein the test controller is designed for checking at least one of the components using the deviation.

7. The test device according to claim 1, wherein the at least one setpoint value is a previously measured actual value, such that the deviation is a measure of reproducibility.

8. The test device according to claim 1, wherein the test device has an energy storage device and the test device is designed to be supplied with energy from the energy storage device.

9. The test device according to claim 1, wherein the test device is configured to receive operating electrical power from a magnetic-inductive flowmeter.

10. The test device according to claim 1, wherein the magnetic field sensor is a Hall sensor.

11. A test device for a monolithic magnetic-inductive flowmeter, wherein the monolithic magnetic-inductive flowmeter to be tested includes a coil, a controller and a measuring tube with two measuring electrodes, wherein each of the measuring electrodes is connected to the controller via a respective measuring line, wherein the coil is designed to generate a magnetic field in a medium in the measuring tube, the measuring electrodes are designed to tap a measuring voltage in the medium generated by a flow of the medium in the magnetic field, and the controller is designed to determine a flow rate of the medium using the measuring voltage transmitted via the measuring lines, the test device comprising:

a test controller; and a magnetic field sensor;

wherein the test device is designed to arrange the magnetic field sensor in the magnetic field;

wherein at least one setpoint value of at least one variable of the magnetic field is stored in the test controller;

wherein the test controller is designed using the magnetic field sensor for measuring at least one actual value of the at least one variable of the magnetic field, for determining a deviation of the at least one actual value from the at least one setpoint value and for displaying the deviation; and wherein the test controller is reversibly connectable to the measuring electrodes without being damaged and the test controller is designed to supply a test voltage between the first terminal and the second terminal.

12. A test method for a test device for a modular magnetic-inductive flowmeter, wherein the modular magnetic-inductive flowmeter to be tested includes a coil, a controller and a measuring module receptacle for a measuring module, wherein the measuring module receptacle has a first terminal and a second terminal and the first terminal and the second terminal are each connected to the controller via a measuring line, wherein the measuring module has a first terminal, a second terminal and a measuring tube with two measuring electrodes, wherein, by inserting the measuring module into the measuring module receptacle, on the one hand the first terminals and on the other hand the second terminals can each be connected to one another, wherein, when the measuring module is inserted, the coil is designed to generate a magnetic field in a medium in the measuring tube, the measuring electrodes are designed to tap a measuring voltage in the medium generated by a flow of the medium in the magnetic field, and the controller is designed to determine a flow rate of the medium using the measuring voltage transmitted via the first terminals and second terminals and the measuring lines, wherein the test device includes a test controller and a test measuring module for the measuring module receptacle, wherein the test measuring module has a holder with a magnetic field sensor, the method comprising:

storing, by the test controller, at least one setpoint value of at least one variable of the magnetic field;

inserting the test measuring module;

generating, by the coil, the magnetic field by the coil;

measuring, by the test controller using the magnetic field sensor, at least one actual value of the at least one variable of the magnetic field; and determining and displaying a deviation of the at least one actual value from the at least one setpoint value;

wherein the test measuring module has a first terminal and a second terminal and the first terminal and the second terminal are each connected to the test controller;

wherein, by inserting the test measuring module, the first terminals, on the one hand, and the second terminals, on the other hand, are each connectable to one another; and wherein the test controller is designed to supply a test voltage between the first terminal and the second terminal.

13. The test method according to claim 12, wherein the test device is designed such that at least one of:

the test measuring module has a first terminal and a second terminal and the first terminal and the second terminal are each connected to the test controller;

by inserting the test measuring module, the first terminals, on the one hand, and the second terminals, on the other hand, can each be connected to one another;

the test controller is designed to supply a test voltage between the first terminal and the second terminal;

the test measuring module is manually insertable into, removable from and fixable in the module receptacle without tools and without damage;

the holder is a measuring tube;

the at least one variable of the magnetic field is a strength and/or a frequency and/or a settling time of the magnetic field;

the variable is a strength of the magnetic field;

the test controller is designed to measure an actual value of the strength of the magnetic field, to determine a setpoint value for the measurement voltage for a setpoint value of a flow rate using the actual value of the strength of the magnetic field, to generate the test voltage with the setpoint value, to read an actual value of the flow rate determined by the controller from the controller, to determine a deviation of the actual value from the setpoint value and to display the deviation;

as components, the controller has the measuring lines, an amplifier for amplifying the measuring voltage, an analog-to-digital converter for digitizing the amplified measuring voltage, a calculating unit for determining the flow rate of the medium using the digitized measuring voltage, and an interface for output of the determined flow rate, and the test controller is designed for checking at least one of the components using the deviation;

the at least one setpoint value is a previously measured actual value, such that the deviation is a measure of reproducibility;

the test device has an energy storage device and the test device is designed to be supplied with energy from the energy storage device;

the test device is configured to receive operating electrical power from a magnetic-inductive flowmeter; and the magnetic field sensor is a Hall sensor.

14. The method according to claim 12, wherein a dry calibration method is performed using the deviation.

15. A test method for a test device for a monolithic magnetic-inductive flowmeter, wherein the monolithic magnetic-inductive flowmeter to be tested comprises a coil, a controller, and a measuring tube having two measuring electrodes, wherein each of the measuring electrodes is connected to the controller via a respective measuring line, wherein the coil is designed to generate a magnetic field in a medium in the measuring tube, the measuring electrodes are designed to tap a measuring voltage in the medium generated by flowing the medium in the magnetic field, and the controller is designed to determine a flow rate of the medium using the measuring voltage transmitted via the measuring lines, wherein the test device comprises a test controller and a magnetic field sensor, wherein the test controller is designed to arrange the magnetic field sensor in the magnetic field, the method comprising:

storing, by the test controller, at least one setpoint value of at least one variable of the magnetic field;

subsequently generating, by the coil, the magnetic field;

measuring, by the test controller using the magnetic field sensor, at least one actual value of the at least one variable of the magnetic field; and determining and displaying a deviation of the at least one actual value from the at least one setpoint value;

wherein the test controller is reversibly connectable to the measuring electrodes without being damaged and the test controller is designed to supply a test voltage between the first terminal and the second terminal.

16. The method according to claim 15, wherein the test device is designed such that at least one of:

the at least one variable of the magnetic field is a strength and/or a frequency and/or a settling time of the magnetic field;

the variable is a strength of the magnetic field;

the test controller is designed to measure an actual value of the strength of the magnetic field, to determine a setpoint value for the measurement voltage for a setpoint value of a flow rate using the actual value of the strength of the magnetic field, to generate the test voltage with the setpoint value, to read an actual value of the flow rate determined by the controller from the controller, to determine a deviation of the actual value from the setpoint value and to display the deviation;

as components, the controller has the measuring lines, an amplifier for amplifying the measuring voltage, an analog-to-digital converter for digitizing the amplified measuring voltage, a calculating unit for determining the flow rate of the medium using the digitized measuring voltage, and an interface for output of the determined flow rate, and the test controller is designed for checking at least one of the components using the deviation;

the at least one setpoint value is a previously measured actual value, such that the deviation is a measure of reproducibility;

the test device has an energy storage device and the test device is designed to be supplied with energy from the energy storage device;

the test device is configured to receive operating electrical power from a magnetic-inductive flowmeter; and the magnetic field sensor is a Hall sensor.

\* \* \* \* \*

14